United States Patent
Wc Huang et al.

(10) Patent No.: US 6,238,989 B1
(45) Date of Patent: May 29, 2001

(54) PROCESS OF FORMING SELF-ALIGNED SILICIDE ON SOURCE/DRAIN REGION

(75) Inventors: Michael Wc Huang, Hsin-Tien; Gwo-Shii Yang, Hsin-Chu; James CC Huang, Kaohsiung; Wen-Yi Hsieh, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/522,663

(22) Filed: Mar. 10, 2000

(51) Int. Cl.[7] .................................................. H01L 21/336
(52) U.S. Cl. ......................... 438/305; 438/607; 438/683
(58) Field of Search .................................. 438/199, 300, 438/303, 231, 562, 582, 607, 649, 655, 656, 682, 683, 297, 230, 642, 684

(56) References Cited

U.S. PATENT DOCUMENTS

| | | | | |
|---|---|---|---|---|
| 5,967,794 | * | 10/1999 | Kodoma | 438/300 |
| 5,998,248 | * | 12/1999 | Ma et al. | 438/231 |
| 6,025,242 | * | 2/2000 | Ma et al. | 438/303 |
| 6,063,675 | * | 5/2000 | Rodder | 438/291 |
| 6,127,233 | * | 10/2000 | Rodder | 438/300 |

* cited by examiner

Primary Examiner—Long Pham
Assistant Examiner—Fernando Toledo

(57) ABSTRACT

A process of forming a silicide on a source/drain region of a MOS device is described, wherein the MOS device has a gate spacer partially covering the source/drain region. A silicon film is formed on the source/drain region, wherein the silicon film has a portion near the gate spacer substantially thinner than the other portion of the silicon film. The silicon film is reacted with a metal film to wholly consume the portion of the silicon film near the gate spacer and to partially consume the other portion of the silicon film.

17 Claims, 3 Drawing Sheets

PROCESS OF FORMING SELF-ALIGNED SILICIDE ON SOURCE/DRAIN REGION

BACKGROUND OF THE INVENTION

1. Technical Field

The present invention relates to semiconductor technology, and, particularly, to a process of forming self-aligned silicides on a MOS device.

2. Description of Related Art

As device dimensions approached 1 micrometer, the conventional contact structures used up to that point began to limit device performance in several ways. For example, the device contact resistance is larger when the area of the source/drain regions is reduced. A variety of contact structures have been investigated to alleviate the above problem. One is self-aligned silicides on the source/drain regions. (When these silicides are formed at the same time as the polycide structure, the approach referred to as a salicide process). The other is raised source/drain regions (formed by Si deposition onto the exposed source/drain regions).

Raised source/drain engineering using selective epitaxial Si (epi-Si) growth has become important recently. This technology not only provides more Si for better salicidation, but also prevents the consumption of substrate silicon during the salicide process. Therefore, low leakage current (resulting from no substrate consumption) can be obtained, which is especially useful for shallow junction applications. However, as shown in FIG. 1, when selective epi-Si 102 is used to form source/drain (S/D) regions 104, pre-amorpharization implant (PAI) hardly reaches the substrate 100. As a result, silicides 106 are formed only above Si-substrate 100 and is separated from the lightly doped drains (LDDs) 108 by a distance 110. This distance 110 causes a region having high series resistance ($R_s$) and low drain current ($I_{dsat}$) between the silicides 106 and the LDDs 108.

SUMMARY OF THE INVENTION

It is an object the present invention to provide a method of forming self-aligned silicides on source/drain regions that satisfies the need identified in the background section.

Other objects and advantages of this invention will become apparent to those of ordinary skill in the art having reference to the following specification in conjunction the drawings.

In the present invention, a method is proposed to solve the prior art issue by forming epitaxial facets on epitaxial silicon film near the gate spacers. By doing so, a light dose pre-amorphization implant (PAI) can be performed onto the substrate near the gate spacers. As TI (or Co) is sputtered on the epitaxial silicon film to form suicides, a smooth but shallow connection will be formed between the silicides and the LDDs. Therefore, a high drain current ($I_{dsat}$) can be obtained without leakage.

To form the facets, the $SiH_2Cl_2$ (dichlorsilane; DCS) concentration is reduced from normally about 150 sccm to about 50 sccm by adding the mixture of $H_2$ flow (about 5 slm) and HCl (about 10–50 sccm). This ratio increases the growing selectivity of epitaxial silicon on silicon (Si) substrate rather than on silicon nitride (SiN), wherein the SiN is a material of the gate spacers.

In another aspect, the present invention provides a process for forming a silicide on a source/drain region of a MOS device, wherein the MOS device has a gate spacer partially covering the source/drain region. A silicon film is formed on the source/drain region, wherein the silicon film has a portion near the gate spacer substantially thinner than the other portion of the silicon film, because of the formation of a facet on the portion of the silicon film. The silicon film is reacted with a metal film, thereby wholly consuming the portion of the silicon film near the gate spacer, and thereby partially consuming the other portion of the silicon film.

The facet inherently guides the silicide toward the spacer, and thereby prevents the lateral growth of the silicide. Because the lateral growth of the silicide is prevented, the contact area and the leakage current are both reduced.

BRIEF DESCRIPTION OF THE DRAWINGS

The foregoing versions and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

FIG. 2A through FIG. 2D schematically illustrate cross-sectional views of a process of forming self-aligned silicides on source/drain regions.

Figure 1:
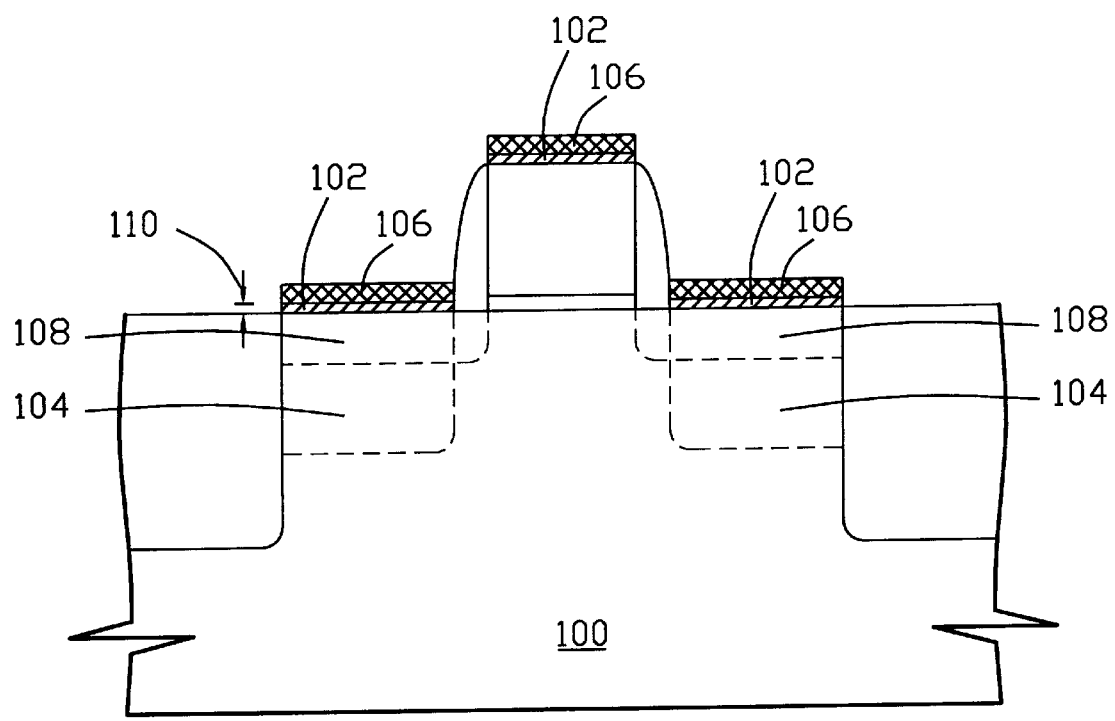
FIG. 1. is a cross-sectional view of a conventional MOS device having silicides thereon.
Figure 2A:
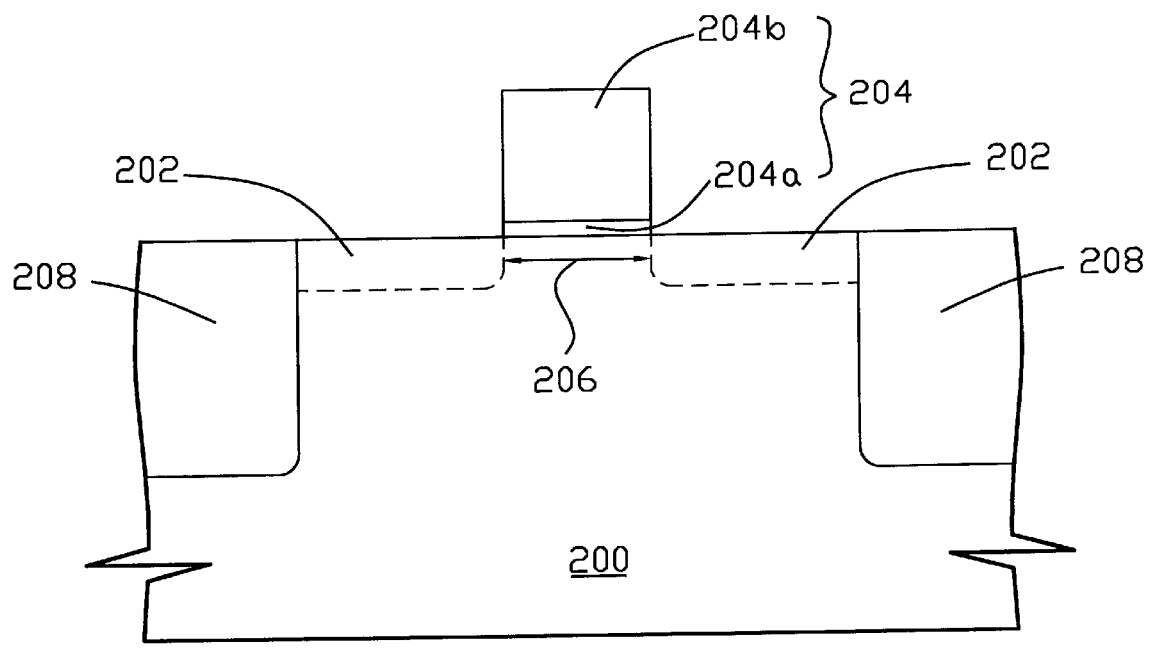
FIGS. 2A through FIG. 2D schematically illustrate cross-sectional views of a process of forming self-aligned silicides on source/drain regions.

Referring to FIG. 2A, lightly doped source/drain regions (LDDs) 202 are formed in a silicon substrate 200 below a gate 204 having sidewalls, to define a channel region 206 in the substrate 200 beneath the gate 204, wherein the LDDs 202 have a first dose concentration. The gate 204 comprises a gate oxide 204a formed in the substrate 200, and comprises a gate electrode (e.g., a polysilicon gate) 204b formed on the gate oxide 204a. The LDDs 202 and the gate 204 are formed in and on the substrate 200 between the shallow trench isolations (STIs) 208.

Figure 2B:
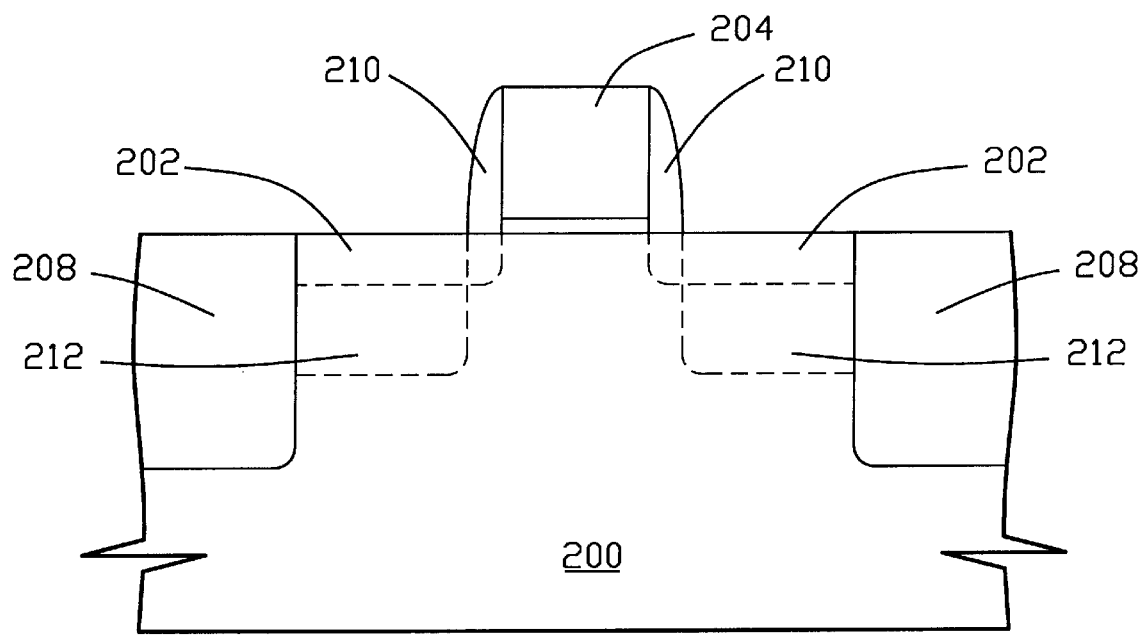

Referring to FIG. 2B, gate spacers, such as silicon nitride spacers 210, are formed on the sidewalls of the gate 204. Then, ions are implanted into the substrate 200 by using the gate 204 and the gate spacers 210 as a mask, to form heavy doped source/drain regions 212 in the substrate 200. The heavily doped source/drain regions 212 have a second dose concentration higher than the first dose concentration of the LDDs 202. The heavily doped source/drain regions 212 and the LDDs 202 collectively serve as source/drain (S/D) regions. In another aspect, the source/drain regions are partially covered with the silicon nitride spacers 210.

Figure 2C:
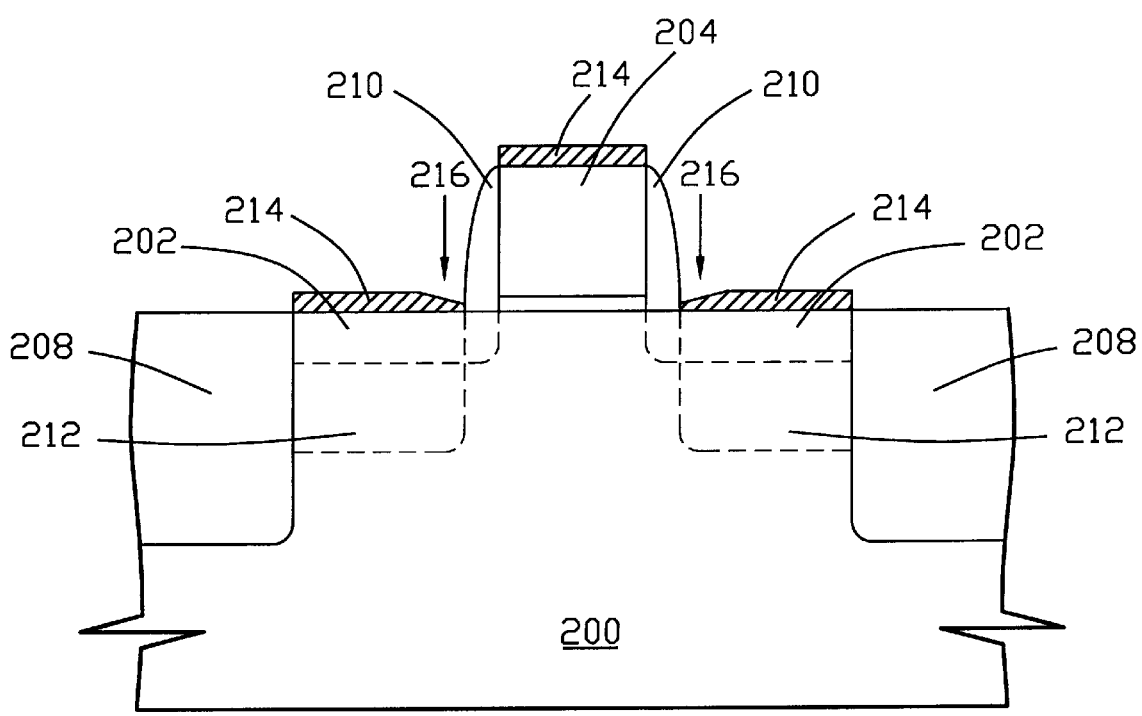
Figure 3:
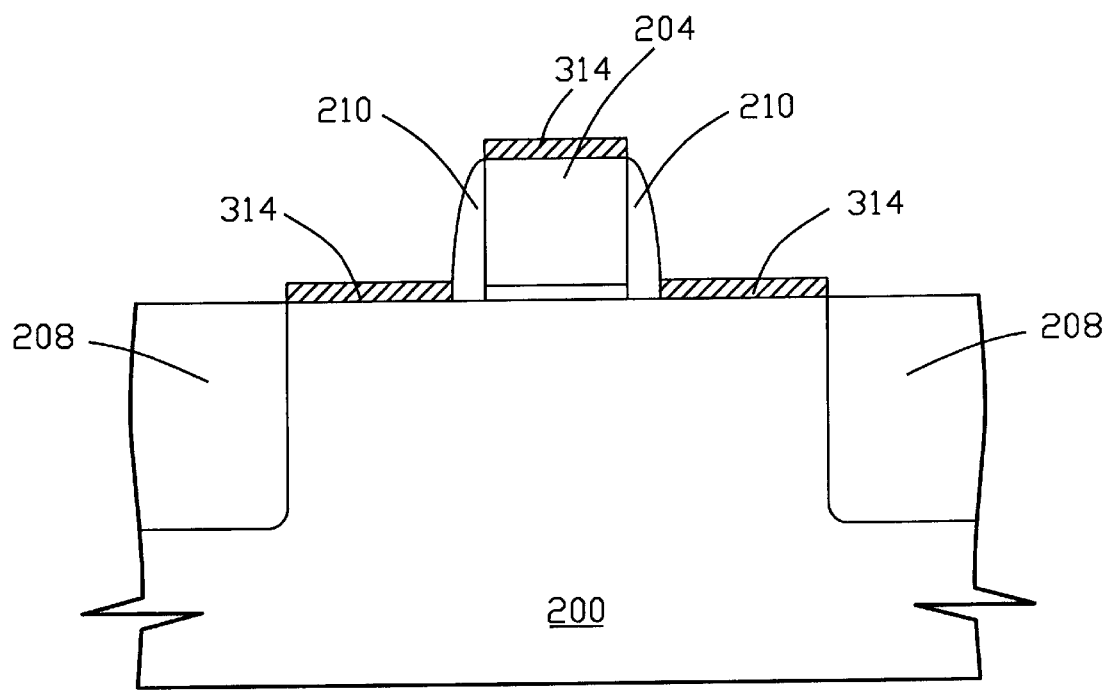
FIG. 3 depicts another type of epitaxial film of silicon formed on a MOS device.

Referring to FIG. 2C, an epitaxial film 214 of silicon is selectively grown on the heavily doped source/drain regions 212 and the gate 204. Compare with FIG. 3 which depicts another type of epitaxial film 314 of silicon, the epitaxial film 214 of FIG. 2C near the spacers 210 has a portion substantially thinner than other portion of the epitaxial film 214, and the portion of the epitaxial film 214 has facets 216 thereon. Note that the same reference numbers from FIG. 2C and FIG. 3 represent the same elements.

Turning to FIG. 2C, the epitaxial film 214 is grown by, for example, introducing $SiH_2Cl_2$, $H_2$ and HCl gases into a reaction zone. To form the facets, it is necessary to reduce the $SiH_2Cl_2$, (dichlorosilane; DCS) gas concentration by adding more mixture of $H_2$ gas and HCl gas. Preferably, the $SiH_2Cl_2$, gas has a flow rate of about 50–150 sccm, the $H_2$ gas has a flow rate of about 5 slm, and the HCl gas has a flow rate of about 10–50 sccm. This ratio facilitates the increase of the growing selectivity of the epitaxial film 214 on silicon (Si) substrate 200 rather than on silicon nitride (SiN) spacers 210. Such ratio is also a reason why the portion of the epitaxial film 214 near the silicon nitride spacers 210 is substantially thinner than the other portion of the epitaxial film 214.

Figure 2D:
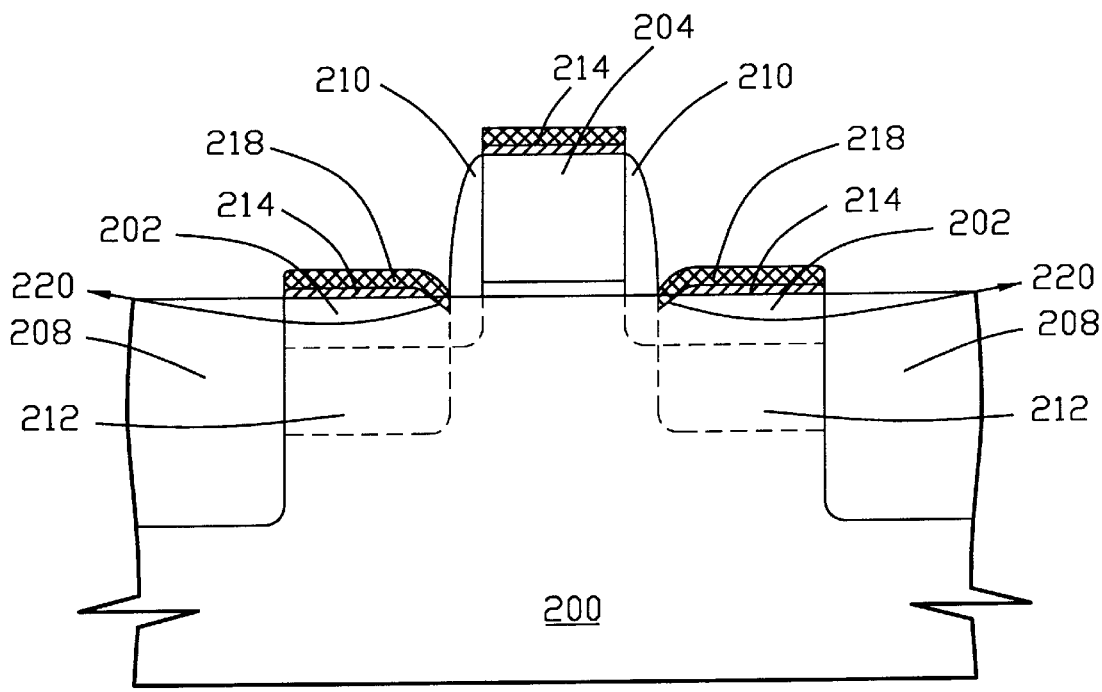

Referring to FIG. 2D, the epitaxial film 214 is reacted with a metal film (not shown) until the thinner portion of the epitaxial film 214 is wholly consumed, whereby the other portion of the epitaxial film 214 is partially consumed to form self-aligned silicides 218 on the heavily doped source/drain regions 212 and the gate 204. At the same time, a smooth but shallow connection 220 is formed between the silicides 218 and the LDDs 202. Therefore, a high drain current ($I_{dsat}$) can be obtained without leakage.

The above metal film is a titanium (Ti) film or a cobalt (Co) film. If the metal film is a titanium film, the reacting step is preferably performed after the epitaxial film 214 has been amorphized. The amorphization can be done by, for example, bombarding other ions in and on the epitaxial film 214. The bombarded ions can reach the silicon substrate 200 near the spacers 210, since the portion of the epitaxial film 214 near the spacers 210 has facets 216 (FIG. 2C) thereon More specifically, the reacting step may further comprise a metal depositing step, a heating step and a selective removal step. In the metal depositing step, a metal film used to form the silicides 218 is deposited. In the heating step, the substrate 200 and the device thereon are heated, which causes the silicide reaction to occur wherever the metal film is in contact with the silicon. Everywhere else, the metal remains unreacted. In the selective removal step, the unreacted metal film is selectively removed through, for example, the use of an etchant that does not attack the silicides 218, the silicon substrate 200, or the spacers 210. As a result, the exposed gate and each source/drain region are now completely covered by silicides 218, but there is no silicide elsewhere.

The above salicide process offers at least the following advantages over the prior art salicide structure:

1. The facets inherently guide the silicides toward the spacers, thereby improving the step coverage of metal deposition.

2. The facets prevent the lateral growth of the silicides.

3. Because the lateral growth of the silicides is prevented, the contact area and the leakage current are both reduced.

Although specific embodiments have been illustrated and described, it will be obvious to those skilled in the art that various modifications may be made without departing from the spirit which is intended to be limited solely by the appended claims. For example, the spacers are not limited to being made of silicon nitride. A skilled person can make the spacers with another kind of material, such as silicon oxide If the spacers are alternatively made of silicon oxide, the silicon film on the source/drain regions should be deposited be an alternative recipe in order to form the facets.

What is claimed is:

1. A salicide process, comprising:

forming lightly doped source/drain regions in a silicon substrate below a gate having sidewalls, to define a channel region in the substrate beneath the gate, wherein the lightly doped source/drain regions have a first dose concentration;

forming spacers on the sidewalls of the gate;

implanting ions into the substrate by using the gate and the spacers as a mask, thereby forming heavy doped source/drain regions in the substrate, the heavy doped source/drain regions having a second dose concentration higher than the first dose concentration;

selectively growing an epitaxial film of silicon on the heavy doped source/drain regions and the gate, wherein the epitaxial film near the spacers has a portion substantially thinner than other portion of the epitaxial film, and wherein the portion of the epitaxial film has facets thereon; and performing a silicide reacting step, thereby reacting the epitaxial film with a metal film until the thinner portion of the epitaxial film is wholly consumed, to selectively form silicides on the gate and the source/drain regions.

2. The salicide process of claim 1, wherein the spacers are made of silicon nitride.

3. The salicide process of claim 2, wherein the growth of the epitaxial film comprises a step of introducing $SiH_2Cl_2$, $H_2$ and HCl gases into a reaction zone.

4. The salicide process of claim 3, wherein the $SiH_2Cl_2$ gas has a flow rate of about 50–150 sccm, the $H_2$ gas has a flow rate of about 5 slm, and the HCl gas has a flow rate of about 10–50 sccm.

5. The salicide process of claim 1, wherein the metal film is a Ti film.

6. The salicide process of claim 1, wherein the metal film is a Co film.

7. The salicide process of claim 5, further comprising a step of amorphizing the epitaxial film before the step of silicide reaction.

8. A method of treating a MOS device on a silicon substrate before a salicide process is performed on the MOS device, wherein the MOS device includes a gate oxide layer and a polysilicon gate sequentially formed on the substrate, silicon nitride spacers formed on the sidewalls of the polysilicon gate and the gate oxide, and source/drain regions formed in the substrate beneath the silicon nitride spacer to define a channel region in the substrate beneath the polysilicon gate, the method comprising:

selectively growing a silicon film over the source/drain regions and the polysilicon gate by introducing $SiH_2Cl_2$, $H_2$ and HCl gases into a reaction zone, wherein the $SiH_2Cl$ gas has a flow rate of about 50–150 sccm, the $H_2$ gas has a flow rate of about 5 Slm, and the HCl gas has a flow rate of about 10–50 sccm, thus the portion of said silicon film near said silicon nitride spacers is substantially thinner than other portions of said silicon film; and reacting the silicon film with a metal film to selectively form silicides on the polysilicon gate and the source/drain regions, wherein the thinnest portion of the silicon film will be wholly consumed.

9. The method of claim 8, wherein the metal film is a titanium (Ti) film.

10. The method of claim 8, wherein the metal film is a cobalt (Co) film.

11. The method of claim 9, further comprising a step of amorphizing the silicon film before the reacting step.

12. A process for forming a silicide on a source/drain region of a MOS device, wherein the MOS device has a gate spacer partially covering the source/drain region, the process comprising:

forming a silicon film on the source/drain region, wherein the silicon film has a portion near the gate spacer substantially thinner than other portion of the silicon film; and reacting the silicon film with a metal film, to wholly consume the portion of the silicon film near the gate spacer, and to partially consume the other portion of the silicon film, thereby selectively forming silicides on the source/drain region.

13. The process of claim 12, wherein the portion of the silicon film has facets thereon.

14. The process of claim 13, wherein the gate spacer is made of silicon nitride.

15. The process of claim 14, wherein the source/drain region is formed in a silicon substrate.

16. The process of claim 15, wherein the formation of the silicon film comprises a step of introducing $SiH_2Cl_2$, $H_2$ and HCl gases into a reaction zone.

17. The process of claim 16, wherein the $SiH_2Cl_2$ gas has a flow rate of about 50–150 sccm, the $H_2$ gas has a flow rate of about 5 slm, and the HCl gas has a flow rate of about 10–50 sccm.

* * * * *